United States Patent
Miyashita et al.

(10) Patent No.: US 6,875,325 B2
(45) Date of Patent: *Apr. 5, 2005

(54) SPUTTERING TARGET PRODUCING FEW PARTICLES

(75) Inventors: Hirohito Miyashita, Ibaraki (JP); Takeo Okabe, Ibaraki (JP)

(73) Assignee: Nikko Materials Company Limited, Tokyo (JP)

( * ) Notice: Subject to any disclaimer, the term of this patent is extended or adjusted under 35 U.S.C. 154(b) by 18 days.

This patent is subject to a terminal disclaimer.

(21) Appl. No.: 10/297,265

(22) PCT Filed: Apr. 20, 2001

(86) PCT No.: PCT/JP01/03386
§ 371 (c)(1),
(2), (4) Date: Apr. 7, 2003

(87) PCT Pub. No.: WO02/16665
PCT Pub. Date: Feb. 28, 2002

(65) Prior Publication Data
US 2003/0155235 A1 Aug. 21, 2003

(30) Foreign Application Priority Data
Aug. 25, 2000 (JP) .................... 2000-255323
Oct. 16, 2000 (JP) .................... 2000-314778

(51) Int. Cl.$^7$ ............................................. C23C 14/34
(52) U.S. Cl. ................................................ 204/298.12
(58) Field of Search ................ 204/298.12, 298.13

(56) References Cited

U.S. PATENT DOCUMENTS 5,863,398 A  *  1/1999  Kardokus et al. ...... 204/298.13

FOREIGN PATENT DOCUMENTS

| JP | 07-126841 | 5/1995 | |
| JP | 08-176816 | 7/1996 | |
| JP | 09-143706 | 6/1997 | |
| JP | 09-272965 A | * 10/1997 | .......... C23C/14/00 |
| JP | 10-030174 | 2/1998 | |
| JP | 11-236663 | 8/1999 | |

OTHER PUBLICATIONS

Patent Abstracts of Japan, One page English Abstract of JP 10–030174.
Patent Abstracts of Japan, One page English Abstract of JP 11–236663.
Patent Abstracts of Japan, One page English Abstract of JP 09–143706.
Patent Abstracts of Japan, One page English Abstract of JP 07–126841.
Patent Abstracts of Japan, One page English Abstract of JP 08–176816.

* cited by examiner

Primary Examiner—Steven Versteeg
(74) Attorney, Agent, or Firm—Howson and Howson

(57) ABSTRACT

A sputtering target having a sprayed coating at least on the side face thereof and producing few particles. The deposit produced on the side face of the sputtering target is prevented from separating and flying.

11 Claims, 1 Drawing Sheet

SPUTTERING TARGET PRODUCING FEW PARTICLES

FIELD OF THE INVENTION

The present invention relates to a sputtering target producing few particles during deposition.

BACKGROUND OF THE INVENTION

In recent years, the sputtering method capable of easily controlling the film thickness and components is being widely used as one of the deposition methods of materials for electronic and electric components.

This sputtering method makes the targets formed of a positive electrode and a negative electrode face each other and applies a high voltage between these substrates and the target under an inert gas atmosphere in order to generate an electric field, and employs the fundamental principle in which plasma is formed upon the atoms ionized at such time colliding with the inert gas, the positive ions within this plasma colliding with the target (negative electrode) surface and discharging the atoms structuring the target, whereby the film is formed by the discharged atoms adhering to the opposing substrate surface.

Upon forming a thin film with this sputtering method, the problem of the production of particles has been attracting attention. In terms of particles caused by the target during the sputtering method, for example, the thin film is deposited within the walls of the thin film forming device and all over the materials and the like therein, in addition to the substrate, when a target is sputtered. Faces and side faces other than the erosion portion of the target are no exceptions, and the deposits of sputtered particles have been observed.

And, flakes separating from such materials and the like within the thin film forming device directly flying on the substrate surface is considered to be one of the major causes for the production of particles.

Moreover, since the side face of the target is not generally facing the plasma directly, there are not that many problems regarding the production of particles from the side face. Thus, conventionally, there were numerous examples wherein measures are taken for the center part of the target and the non-erosion portion of the peripheral edge. Nevertheless, there is a trend toward the overall face of the sputtering face being sputtered in order to improve the target usage efficiency, and such measures may adversely increase the particles.

Recently, while the degree of integration of LSI semiconductor devices has increased (16 M bit, 64 M bit and even 256 M bit) on the one hand, it is also becoming miniaturized with the wiring width being less than 0.25 µm in some cases, and problems such as the disconnection and short circuit of wiring due to the foregoing particles now occur more frequently.

As described above, the production of particles is now even a larger problem pursuant to the advancement of high integration and miniaturization of electronic device circuits.

Generally, a sputtering target is connected to a backing plate having a larger measurement with such means as welding, diffusion bonding or soldering. From the perspective of the stabilization of sputtering, however, the side face of the sputtering target to be connected to the backing plate is usually formed to have an inclined face broadening toward such backing plate.

As publicly known, a backing plate plays the role of cooling the target by the back face thereof contacting a coolant, and materials such as aluminum or copper or the alloys thereof having a favorable thermal conductivity are used.

The side face of the foregoing sputtering target is not the portion which will erode (become subject to wear) from sputtering. Nonetheless, since it is close to the erosion face of the target, there is a trend toward the sputtered particles flying during the sputtering operation further adhering and depositing thereto.

In general, the erosion face of a sputtering target has a smooth surface from the turning process, and the foregoing inclined side face is similarly subject to the turning process.

Whereas, it has become known the sputtered particles (deposits) once adhered to the inclined side face are separated therefrom once again, float, and cause the production of particles.

Further, it has been observed that, rather than from the vicinity of the flat peripheral erosion face, the separation of such deposits occurs more often from a location distant therefrom.

This kind of phenomenon has not necessarily been clearly understood, nor were measures taken therefor. However, the production of particles in such locations has also become a major problem in light of the demands of the high integration and miniaturization of electronic device circuits as described above.

In order to overcome the foregoing problems, a proposal has been made of performing blast processing to the target side face and the backing plate vicinity and improving the adhesiveness thereby with the anchor effect.

Nevertheless, in such a case, problems such as the contamination of goods due to the remnants of the blast materials, separation of the adhered particles deposited on the residual blast materials, and separation of the adhered film caused by the selective and uneven growth thereof would newly arise, and the fundamental issues could not be resolved.

Further, even upon particularly performing such blast processing, particles tend to be produced due to the differences in the materials between the target side face and the backing plate and the difference in thermal expansion as a result thereof, and the evident difference between the materials. And, in such a case, since it is far from the foregoing erosion portion, there is problem in that this will go unnoticed as a cause of the production of particles.

OBJECT OF THE INVENTION

An object of the present invention is to obtain a sputtering target capable of directly preventing the separating and flying of the deposit produced from the side face of the sputtering target, particularly between the target side face and the backing plate.

SUMMARY OF THE INVENTION

In order to achieve the foregoing object, the present inventors discovered that the production of particles within the deposition could be efficiently suppressed by devising the structure of the sputtering target and the structure between the target side face and the backing plate.

Based on this discovery, provided is:
1. A sputtering target producing few particles characterized in comprising a sprayed coating having a surface roughness of 10 to 20 µm Ra (average roughness of center line) along the backing plate direction or backing plate face from a side face position slightly distant than the sputtering face of the sputtering target;

2. A sputtering target producing few particles according to paragraph 1 above, characterized in that the side face of the sputtering target is an inclined face;
3. A sputtering target producing few particles according to paragraph 1 or paragraph 2 above, characterized in that the side face of the sputtering target to be connected with the backing plate has an inclined face broadening toward the backing plate;
4. A sputtering target producing few particles according to each of paragraphs 1 to 3 above, characterized in sequentially comprising a sprayed coating along the sputtering target side face or the backing plate face;
5. A sputtering target producing few particles according to each of paragraphs 1 to 4 above, characterized in comprising a sprayed coating along the backing plate direction or backing plate face from a side face position slightly distant than the sputtering face of the sputtering target; and
6. A sputtering target producing few particles according to each of paragraphs 1 to 5 above, characterized in that an aluminum alloy is used as the sprayed coating.

DETAILED DESCRIPTION OF THE PREFERRED EMBODIMENTS

Figure 1:
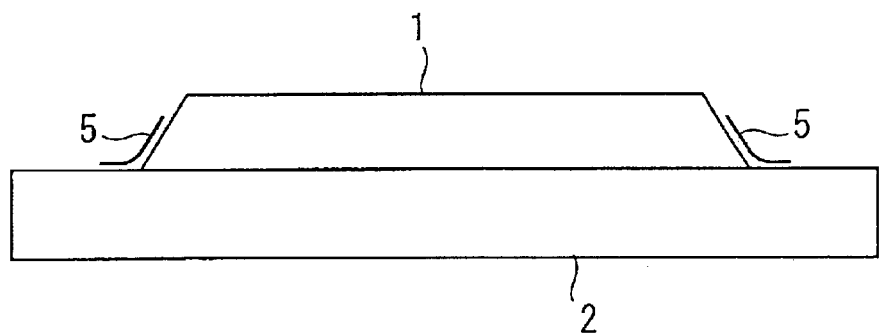
FIG. 1 is an explanatory diagram of the cross section showing an example of the sputtering target—backing plate assembly.

The sputtering target of the present invention may be employed in a rectangular or circular target, as well as targets of other shapes, and, since these targets are thick, they have all side faces. Although the side faces are often inclined faces as described above, the present invention may also be employed in sputtering targets having a structure of perpendicular faces or planar faces successive thereto. The present invention includes all of the above.

The basic background of the present invention is as follows. As mentioned above, it has been observed that the sputtered particles (deposits) once adhered to the inclined side face are separated therefrom once again, float, and cause the production of particles, and, it has become known that, rather than from the vicinity of the flat peripheral erosion face, the separation of such deposits occurs more often from a location distant therefrom. Thus, in order to get to the bottom of the cause of production of particles, this phenomenon was foremost investigated.

As described above, although the erosion face of a sputtering target has a smooth surface from the turning process, and the foregoing inclined side face is similarly subject to the turning process, it has become clear that numerous differences are formed in steps with this type of inclined side face when viewed microscopically due to the characteristics of the turning process.

When sputtering with this type of sputtering target, the sputtered particles adhering to the flat peripheral erosion face and the inclined face near such erosion face have a relatively fast speed and energy, and tend to have strong adhesiveness.

Therefore, the sputtered particles flying as a result of sputtering will adhere in layers, and such layered attachments rarely separate. Thus, it is comparatively less frequent that these layers will peal off and float, and this is not a major problem in the production of particles.

Nevertheless, even with the same inclined face, regardless of the number and thickness of sputtered particles adhering to the inclined face of the sputtering target becoming less pursuant to the distance from the flat erosion face becoming farther, an entirely opposite phenomenon was observed in that the separation of such adhered particles increased.

When investigating the cause of this, foremost, regarding the sputtered particles, it has become known that although the amount of sputtered particles will decrease, the flying speed will slow down, and the adhesive energy will also decrease.

Meanwhile, since the side face of the target is of a step shape as described above, at the side face distant from the flat erosion face, it has been observed that the particles separated in a pillar shape do not adhere in large amounts in layers, but rather adhere in small amounts in each step. And, this type of adhesion in a pillar shape tends to be much easier to peel off in comparison to a layered adhesion on a single face.

Moreover, this kind of phenomenon and trend were more noticeable when the side face is inclined rather than perpendicular.

Thus, the prime task was to suppress such separation and to prevent the separation of adhered particles that cause the production of particles from the sputtering target side face.

In order to explain the present invention, the structure of the sputtering target and backing plate assembly is shown in FIG. 1. Ordinarily, the sputtering target 1 is mounted on the backing plate 2, and connected with row connection or the like.

Figure 2:
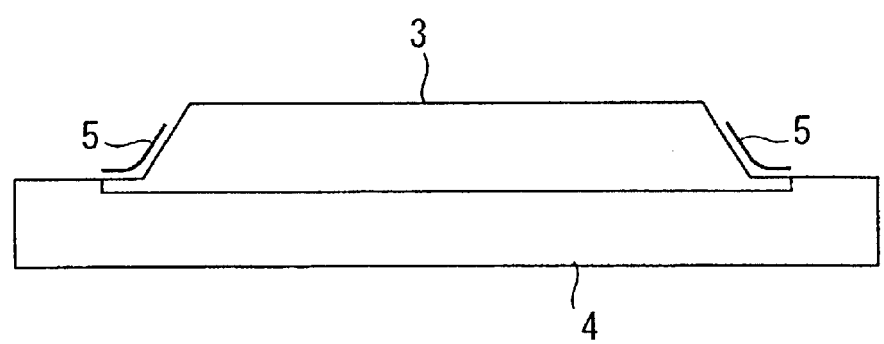
FIG. 2 is an explanatory diagram of the cross section showing another example of the sputtering target—backing plate assembly.

FIG. 2 is a modification thereof, and the backing plate area to which the sputtered particles fly and adhere during sputtering is made to be of the same material as the target 3 in the assembly of the sputtering target 3 and the backing plate 4.

In other words, although this example illustrates a mode where the target 3 is embedded in the backing plate 4, the edge portion of the target 3 is of a shape exceeding the backing plate area to which the sputtered particles fly and adhere during sputtering.

The present invention is a sputtering target having a sprayed coating at least on the side face thereof. Reference numeral 5 in FIG. 1 and FIG. 2 represents the sprayed coating.

It is sufficient to form the sprayed coating at a position lower than the sputtering face of the target side face. This is because separation hardly occurs at the position near the sputtering face of the target side face. Further, when there is concern regarding the contamination due to the spraying material, it is desirable to form such sprayed coating along the backing plate direction or on the backing plate from a position slightly distant (lower position) than the sputtering face as depicted in FIG. 1 and FIG. 2.

Thereby, the anchor effect of the surface roughness and surface structure unique to the sprayed coating will reduce the separation of deposits to such portion, and a significant effect was yielded in that the generation of particles was reduced.

As the material of the sprayed coating, a material of the same quality of material as the target material may be used, or other materials may be used. Here, the only limitation would be that it is desirable to use a material that will not contaminate the sputtering thin film to the substrate. As described above, since the sprayed coating shows a unique anchor effect, this is not particularly limited unless it becomes a cause of contamination due to the sprayed coating separates as a result of the sprayed coating becoming vulnerable.

As such examples, used may be Ti, Zr, Hf, Nb, Ta, Mo, W, Al, Cu, alloys with these as the main component, and nitrides, carbides, carbonitrides, oxides thereof and the like. Moreover, as the backing plate material, the ordinarily used copper, copper alloy, aluminum, aluminum alloy and the like may be used, and there is no limitation.

When the side face of the sputtering target is of an inclined face, in particular, the present invention may be used for sputtering targets in which the side face thereof to be connected to the backing plate is broadening toward such backing plate.

Particularly, with the sprayed coating of the present invention, it is desirable that the sprayed coating is formed successively along the sputtering target side face and the backing plate face.

As described above, there is a trend toward the particles being produced due to the differences in the materials between the target side face and the backing plate and the difference in thermal expansion as a result thereof, and the evident difference between the materials. Nevertheless, by forming a sprayed coating having a strong anchor effect at this problematic portion, the production of particles may be effectively prevented.

The formation of the successive sprayed coatings to the backing plate may be over the entire face in which the target is exposed, or may be in the vicinity of the connection with the target. The present invention includes all of the above. Therefore, it goes without saying that the sprayed coating may be employed in the structured depicted in FIG. 2, and the sprayed coating may be formed successively along the sputtering target side face, lower planar face and backing plate face.

EXAMPLES

Next, the Examples and Comparative Examples of the present invention are explained. The Examples are mere exemplifications of the present invention, and shall not limit the present invention in any way. In other words, modifications and other modes based on the technical spirit of the present invention shall all be included herein.

Example 1

A discoid target when viewed two-dimensionally, which is high purity Ti (5N purity) having a diameter of 300 mm and thickness of 10 mm, was bonded with an Al alloy backing plate with diffusion bonding in order to prepare a sputtering target—backing plate assembly having an overall thickness of 17 mm.

This structure is the assembly structure of the target and backing plate illustrated in FIG. 1.

A sprayed coating to which Al was sprayed and having a surface roughness of 16, 14, 17 $\mu$m Ra and thickness of 250 $\mu$m was formed on the side face of this target. This was mounted on a magnetron sputtering sputter device, TiN reactive sputtering was performed thereto, and a TiN film was formed until the thickness became 20 $\mu$m in order to examine the production of particles.

For comparative purposes, a target outside the conditions of the present invention; that is, a target in which a sprayed coating is not formed on the side face thereof was prepared, reactive sputtering of TiN having a thickness of 4 $\mu$m was performed under the same conditions in order to examine the generation of particles. Similarly, reactive sputtering of TiN having a thickness of 4 $\mu$m was performed under the same conditions upon preparing a target in which a sprayed coating having a surface roughness of 5 $\mu$m, 7 $\mu$m, 23 $\mu$m Ra was formed on the side face thereof in order to examine the production of particles (Comparative Example 1). The following results are an average of 10 sample tests.

The results of foregoing Example 1 are shown together with Comparative Example 1 in Table 1.

TABLE 1

| | Sample No. | TiN Film Thickness ($\mu$m) | Existence of Sprayed Coating on Side Face | Surface Roughness of Sprayed Coating (Ra) | Existence of Separation of Sputtered Particles |
|---|---|---|---|---|---|
| Example 1 | 1 | 4 | Existing | 16 $\mu$m | None |
| | 2 | 6 | Existing | 14 $\mu$m | None |
| | 3 | 20 | Existing | 17 $\mu$m | None |
| Comparative Example 1 | 4 | 4 | None | — | Existing (Numerous Separations) |
| | 5 | 4 | Existing | 5 $\mu$m | Existing |
| | 6 | 4 | Existing | 7 $\mu$m | Existing |
| | 7 | 4 | Existing | 23 $\mu$m | Separation of Sprayed Coating Itself |

Sample Nos. 1 to 3 are the Examples of the present invention, and Sample Nos. 4 to 7 are the Comparative Examples. In this Table, the adhesive mode of the sputtered particles and the existence of separation were observed for each sample.

As evident from the foregoing Table 1, Comparative Example Sample No. 4 without a sprayed coating formed on the side face thereof showed numerous separations of the deposited films on the side face with a TiN film having a thickness of 4 $\mu$m (regardless of the thickness or thinness of the film). This is considered to be because there is hardly any anchor effect of the side face. Moreover, with Comparative Examples Sample Nos. 5 and 6, this is considered to be because the anchor effect was low due to the surface roughness of the sprayed coating being small. With Comparative Example Sample 7, the sprayed coating itself separated most likely because the respective particle connection of the sprayed coating was weak.

Contrarily, with Sample Nos. 1 to 3 of the present Example, it has been observed that the sputtered particles deposit evenly in layers, and no separation could be acknowledged.

Although the foregoing Example is an exemplification, similar results were obtained under different sputtering conditions other than the TiN reactive sputtering, and similar results were further obtained even upon changing the shape of the sputtering target.

Example 2

Similar to Example 1, a discoid target when viewed two-dimensionally, which is high purity Ti (5N purity) having a diameter of 300 mm and thickness of 10 mm, was bonded with an Al alloy backing plate with diffusion bonding in order to prepare a sputtering target—backing plate assembly having an overall thickness of 17 mm structured as illustrated in FIG. 2.

A sprayed coating to which Al was sprayed successively and having a surface roughness of 16, 12, 18 μm Ra and thickness of 300 μm was formed on the side face of this target and the backing plate. This was mounted on a magnetron sputtering sputter device, TiN reactive sputtering was performed thereto, and a TiN film was formed until the thickness became 30 μm in order to examine the production of particles.

For comparative purposes, a target in which a sprayed coating is not formed on the side face of the sputtering target—backing plate assembly of the same structure was prepared in order to examine the generation of particles. Similarly, reactive sputtering of TiN having a thickness of 3 μm was performed under the same conditions upon preparing a target in which a sprayed coating having a surface roughness of 5, 8, 25 μm Ra was formed on the side face thereof in order to examine the production of particles (Comparative Example 2). The following results are an average of 10 sample tests.

The results of foregoing Example 2 are shown together with Comparative Example 2 in Table 2.

TABLE 2

| Sample No. | TiN Film Thickness (μm) | Existence of Sprayed Coating on Side Face | Surface Roughness of Sprayed Coating (Ra) | Existence of Separation of Sputtered Particles |
|---|---|---|---|---|
| Example 2 | 8 | 3 | Existing | 16 μm | None |
| | 9 | 7 | Existing | 12 μm | None |
| | 10 | 30 | Existing | 18 μm | None |
| Comparative Example 2 | 11 | 4 | None | — | Existing (Numerous Separations) |
| | 12 | 3 | Existing | 5 μm | Existing (Numerous Separations) |
| | 13 | 3 | Existing | 8 μm | Existing (Some Separations) |
| | 14 | 3 | Existing | 25 μm | Separation of Sprayed Coating Itself |

Sample Nos. 8 to 10 are the Examples of the present invention, and Sample Nos. 11 to 14 are the Comparative Examples. In this Table, the adhesive mode of the sputtered particles and the existence of separation were observed for each sample.

As evident from the foregoing Table 2, Comparative Example Sample No. 11 without a sprayed coating formed on the side face thereof showed the deposition of sputtered particles in a pillar shape and numerous separations of the deposited films on the side face with a TiN film having a thickness of 4 μm (regardless of the thickness or thinness of the film). This is considered to be because there is hardly any anchor effect of the side face.

Moreover, with Comparative Examples Sample Nos. 12 and 13, this is considered to be because the anchor effect was low due to the surface roughness of the sprayed coating being small. With Comparative Example Sample 14, the sprayed coating itself separated most likely because the respective particle connection of the sprayed coating was weak.

Contrarily, with Sample Nos. 8 to 10 of the present Example, it has been observed that the sputtered particles deposit evenly in layers, and no separation could be acknowledged.

As in the present Examples, when Al is sprayed successively to the target side face and the backing plate, the prevention effect of the separation of sputtered particles is high, and is further effective in preventing the production of particles.

Example 3

Similar to Example 1, a discoid target when viewed two-dimensionally, which is high purity Ti (5N purity) having a diameter of 300 mm and thickness of 10 mm, was bonded with an Al alloy backing plate with diffusion bonding in order to prepare a sputtering target—backing plate assembly having an overall thickness of 17 mm structured as illustrated in FIG. 1.

Al+5% Mg alloy was sprayed to the side face of this target in order to form a sprayed coating having a surface roughness of 14, 17, 19 μm Ra and thickness of 250 μm.

This was mounted on a magnetron sputtering sputter device, TiN reactive sputtering was performed thereto, and a TiN film was formed until the thickness became 35 μm in order to examine the production of particles.

For comparative purposes, a target in which a sprayed coating having a surface roughness of 4, 7, 27 μm Ra is formed on the side face of the sputtering target—backing plate assembly of the same structure was prepared and reactive sputtering of TiN having a thickness of 5 μm was performed under the same conditions in order to examine the production of particles (Comparative Example 3). The following results are an average of 10 sample tests.

The results of foregoing Example 3 are shown together with Comparative Example 3 in Table 3.

TABLE 3

| | Sample No. | TiN Film Thickness (μm) | Surface Roughness of Sprayed Coating (Ra) | Existence of Separation of Sputtered Particles |
|---|---|---|---|---|
| Example 3 | 15 | 5 | 14 μm | None |
| | 16 | 20 | 17 μm | None |
| | 17 | 35 | 19 μm | None |
| Comparative Example 3 | 18 | 5 | 4 μm | Existing (Numerous Separations) |
| | 19 | 5 | 7 μm | Existing (Some Separations) |
| | 20 | 5 | 27 μm | Separation of Sprayed Coating Itself |

Sample Nos. 15 to 17 are the Examples of the present invention, and Sample Nos. 18 to 20 are the Comparative Examples. In this Table, the adhesive mode of the sputtered particles and the existence of separation were observed for each sample.

As evident from the foregoing Table 3, Comparative Example Sample Nos. 18 and 19 showed separations of the sputtered particles. This is considered to be because the anchor effect was low due to the surface roughness of the sprayed coating being small.

Moreover, with Comparative Example Sample 20, although separation of the sprayed coating itself was observed, this is considered to be because the respective particle connection of the sprayed coating was weak, and the spray coating itself separated as a result thereof.

Contrarily, with Sample Nos. 15 to 17 of the present Example, it has been observed that the sputtered particles deposit evenly in layers, and no separation could be acknowledged.

Example 4

Similar to Example 2, a discoid target when viewed two-dimensionally, which is high purity Ti (5N purity) having a diameter of 300 mm and thickness of 10 mm, was bonded with an Al alloy backing plate with diffusion bonding in order to prepare a sputtering target—backing plate assembly having an overall thickness of 17 mm structured as illustrated in FIG. 2. Al+5% Mg alloy was successively sprayed to the side face of this target in order to form a sprayed coating having a surface roughness of 15, 13, 18 μm Ra and thickness of 300 μm.

This was mounted on a magnetron sputtering sputter device, TiN reactive sputtering was performed thereto, and a TiN film was formed until the thickness became 37 μm in order to examine the production of particles.

For comparative purposes, a target in which a sprayed coating having a surface roughness of 3, 8, 26 μm Ra is formed on the side face of the sputtering target—backing plate assembly of the same structure was prepared and reactive sputtering of TiN having a thickness of 6 μm was performed under the same conditions in order to examine the production of particles (Comparative Example 4). The following results are an average of 10 sample tests.

The results of foregoing Example 4 are shown together with Comparative Example 4 in Table 4.

TABLE 4

| | Sample No. | TiN Film Thickness (μm) | Surface Roughness of Sprayed Coating (Ra) | Existence of Separation of Sputtered Particles |
|---|---|---|---|---|
| Example 4 | 21 | 6 | 15 μm | None |
| | 22 | 21 | 13 μm | None |
| | 23 | 37 | 18 μm | None |
| Comparative Example 4 | 24 | 6 | 3 μm | Existing (Numerous Separations) |
| | 25 | 6 | 8 μm | Existing (Some Separations) |
| | 26 | 6 | 26 μm | Separation of Sprayed Coating Itself |

Sample Nos. 21 to 23 are the Examples of the present invention, and Sample Nos. 24 to 26 are the Comparative Examples. In this Table, the adhesive mode of the sputtered particles and the existence of separation were observed for each sample.

As evident from the foregoing Table 4, Comparative Example Sample Nos. 24 and 25 showed separations of the sputtered particles. This is considered to be because the anchor effect was low due to the surface roughness of the sprayed coating being small.

Moreover, with Comparative Example Sample 26, although separation of the sprayed coating itself was observed, this is considered to be because the respective particle connection of the sprayed coating was weak, and the spray coating itself separated as a result thereof.

Contrarily, with Sample Nos. 21 to 23 of the present Example, it has been observed that the sputtered particles deposit evenly in layers, and no separation could be acknowledged.

When an Al alloy is sprayed as in Examples 3 and 4, in comparison to the aluminum-sprayed Examples 1 and 2, the prevention effect of the separation of sputtered particles is higher, and is further effective in preventing the production of particles.

Yielded is a superior effect of being able to directly prevent the separating and flying of the deposit produced from the side face of the sputtering target, particularly between the target side face and the backing plate.

What is claimed is:

1. A sputtering target producing few particles, comprising a sputtering target having a sputtering face, an opposite face engaged to a backing plate and a side face extending between the sputtering and opposite faces, and a sprayed coating having a surface roughness of 10 to 20 μm Ra (average roughness of center line), said sprayed coating being located only on the side face of the sputtering target from a location beginning at a spaced distance from said sputtering face and extending in a direction toward said backing plate such that said sprayed coating does not extend on said sputtering face or on a part of said side face adjacent said sputtering face.

2. A sputtering target producing few particles according to claim 1, characterized in that the side face of the sputtering target is an inclined face.

3. A sputtering target according to claim 2, wherein said side face of said sputtering target is an inclined face broadening toward said backing plate.

4. A sputtering target according to claim 3, wherein said sprayed coating extends continuously from said side face of the sputtering target onto a face of said backing plate.

5. A sputtering target according to claim 4, wherein said sprayed coating is an aluminum alloy.

6. A sputtering target according to claim 3, wherein said sprayed coating is an aluminum alloy.

7. A sputtering target according to claim 2, wherein said sprayed coating extends continuously from said side face of the sputtering target onto a face of said backing plate.

8. A sputtering target according to claim 2, wherein said sprayed coating is an aluminum alloy.

9. A sputtering target according to claim 1, wherein said side face of said sputtering target is an inclined face broadening toward said backing plate.

10. A sputtering target according to claim 1, wherein said sprayed coating extends continuously from said side face of the sputtering target onto a face of said backing plate.

11. A sputtering target according to claim 1, wherein said sprayed coating is an aluminum alloy.

* * * * *